United States Patent
Dirks

(10) Patent No.: US 7,671,474 B2
(45) Date of Patent: Mar. 2, 2010

(54) INTEGRATED CIRCUIT PACKAGE DEVICE WITH IMPROVED BOND PAD CONNECTIONS, A LEAD-FRAME AND AN ELECTRONIC DEVICE

(75) Inventor: Peter Adrianus Jacobus Dirks, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/817,019

(22) PCT Filed: Feb. 15, 2006

(86) PCT No.: PCT/IB2006/050492

§ 371 (c)(1),
(2), (4) Date: Apr. 22, 2008

(87) PCT Pub. No.: WO2006/090304

PCT Pub. Date: Aug. 31, 2006

(65) Prior Publication Data

US 2008/0265384 A1  Oct. 30, 2008

(30) Foreign Application Priority Data

Feb. 23, 2005  (EP) .................................. 05101384

(51) Int. Cl.
*H01L 23/495* (2006.01)
(52) U.S. Cl. .............................. 257/760; 257/E23.015
(58) Field of Classification Search ................. 257/666, 257/670, E23.015
See application file for complete search history.

(56) References Cited

U.S. PATENT DOCUMENTS 5,457,340 A    10/1995  Templeton, Jr. et al.
6,100,598 A *   8/2000  Kanesaka .................... 257/787
6,646,339 B1   11/2003  Ku et al.
2002/0140061 A1  10/2002  Lee
2005/0006735 A1 *  1/2005  an Tatt et al. ................ 257/676

* cited by examiner

*Primary Examiner*—David A Zarneke
*Assistant Examiner*—Jenny L Wagner

(57) ABSTRACT

A semiconductor device package (10) with a substantially rectangular shape comprising: a die attach pad (12) having a top surface and a bottom surface; a plurality of contact pads (26i-26n) provided in at least four rows that correspond to the rectangular shape of the package, each contact pad having a top surface and a bottom surface; at least two tie bars (18) for supporting the die attach pad until the singulation of the package during manufacturing thereof the tie bars having a top surface and a bottom surface and extending from the die attach pad towards a corner of the package; —a semiconductor die (20) mounted on the top surface of the die attach pad (12) and having bonding pads (44) formed thereon; a plurality of electrical connections between selected ones of the bond pads (44) and corresponding ones of the contact pads (26i-26n); an encapsulation encapsulating the semiconductor die (20), the top surface of the die attach pad (12), the electrical connections, the top surface of the tie bars (18) and the top surfaces of the contact pads (26^2On), and leaving the bottom surface of the die attach pad and the bottom surface of the contact pads exposed; characterized in that, at least one strip (30) having a top surface and a bottom surface is disposed between the die attach pad (12) and a corresponding row of contact pads, the strip having at least one lateral part (36) that is connected to at least one of the contact pads in said row, electrical connections being provided between the strip and selected bond pads (44) on the semiconductor die (20) adjacent to the strip.

11 Claims, 3 Drawing Sheets

FIG. 2 (line A - A')

INTEGRATED CIRCUIT PACKAGE DEVICE WITH IMPROVED BOND PAD CONNECTIONS, A LEAD-FRAME AND AN ELECTRONIC DEVICE

The present invention relates to an integrated circuit package device according to the preamble of claim 1.

The present invention also relates to a leadframe that is used to manufacture an integrated circuit device package.

Furthermore, the present invention relates to an electronic device comprising an electronic carrier, such as a printed circuit board, on which a semiconductor device package is connected.

A package, as described in the first paragraph, is known for example from U.S. Pat. No. 6,229,200, which discloses leadless plastic chip carriers that are formed from a matrix of leadframes and have a flexible configuration. A leadframe matrix is applied, which integrates a plurality of contact pads and die attach pads in order to allow production in large series.

The problem with the prior art packages is their relatively large overall size. There is an ever-increasing need for smaller packages, since they are cheaper to produce and enable to provide more functions within a pre-determined volume of an electronic device.

It is an object of the present invention to provide an integrated circuit device package according to the preamble of claim 1 that has a smaller size and thus also to provide a cheaper package in comparison with the prior art packages.

According to the present invention, this object is obtained by the technical measure as described in the characterizing portion of claim 1.

Disposing at least one strip between the die attach pad and a row of contact pads allows the bond pads requiring a low ohmic connection to be connected to the strip which bond pads are disposed at various locations on the semiconductor die, which connections are directly linked to one contact pad only via the lateral part of the strip. This reduces the required number of contact pads and thus reduces package size and cost. Package size is mainly determined by the number of contact pads (sometimes also referred to as contact pins) in the respective rows of contact pads in the package.

It has been found that, without strips, 56 contact pads could be accommodated in a 7×7 mm QFN package. By applying two strips it appeared that 48 contact pads were sufficient in order to provide a package for the same semiconductor die, that is to say a die with the same functions. A package with 48 contact pads could be accommodated in a 6×6 mm QFN package. The same principle applies for packages with more contact pads, e.g. 9×9 mm packages, or with fewer contact pads, e.g. 5×5 mm packages.

An additional advantage of the present invention is an improved connection to the outside world. A number of bond pads located at various locations on the semiconductor die require a low ohmic connection to the corresponding electrical signal (with similar electrical potential) in the outside world. Bond pads related to power supply signals for example need such a connection in order to obtain efficient energy use of the battery. This is particularly the case for battery-operated portable devices such as a mobile phone, a digital camera, a playstation, etc. In the prior art, the bond pads requiring a low ohmic connection were connected to the outside world via different contact pads that are distributed over various locations of the package, which requires relatively long bonding wires. According to the invention, the resistance and the inductance of the connection to the outside world is reduced, since shorter bonding wires can be applied due to the smaller distance between the bond pads on the die and the strip as compared to the distance between the bond pads and the contact pads and given the fact that the resistance of the leadframe per unit of length is smaller than the resistance of the bonding wire per unit of length.

Package size is mainly determined by the number of contact pads and the mutual distance between them, at least for the major part of package applications. The size of the die in the package and the corresponding die attach pad normally is relatively small compared to the overall size of the package, again at least for the major part of package applications, which leaves sufficient room to provide one or more strips as described above.

In an advantageous embodiment of the present invention, two strips are disposed between the die attach pad and a corresponding row of contact pads. This allows applying the concept of the invention to two different areas on the die, each area being disposed adjacent to a corresponding strip. In this embodiment, it is especially preferred that both strips are disposed adjacent to opposing sides of the die attach pad, which is beneficial in respect of a symmetrical design of the leadframe matrix that is used for manufacturing a semiconductor device package according to the present invention.

In another advantageous embodiment of the present invention, the bond pads on the semiconductor die that are electrically connected to a strip are used for power supply signals and or signals requiring a low ohmic connection, such as reference voltage signals or ground signals. These types of bond pads benefit most from a nearby electrical connection to the strip, since the resistance of the leadframe material per unit of length is smaller than the resistance of the bondwire per unit of length.

Power supply (like the battery voltage), analog and digital ground and reference voltages are typically required at various locations on the chip, and the corresponding bond pads will therefore benefit from the nearby location of the strip.

In yet another advantageous embodiment of the present invention, the strip comprises lateral parts that are connected to two contact pads in a corresponding row. This provides for improved mechanical stability of the strip regarding its connection to the corresponding leadframe. Therefore, this feature is advantageous mainly during the manufacturing process of the package up to the step of molding the encapsulation.

According to the invention, it is advantageous that the bottom surface of the strip is exposed. An exposed strip means that during the wire bonding process, which is preferably applied for establishing the electrical connection between the strip and the bond pads, the strip will be supported, for example by means of a support tape attached to the leadframe, which will be explained in more detail below. If the strip is not properly supported, which for example would be the case when the strip area is half-etched (and consequently not exposed), it becomes very difficult to establish a proper wire bond. In that case one needs to take at least special measures to provide a proper support, like for example providing a support with protrusions.

According to the invention, it is also advantageous that the electrical connections comprise wires that are bonded between the bond pads and the contact pads and/or between the bond pads and the strips. Wire bonding is a well known and reliable method of providing the electrical connections within a package.

The invention will be further explained hereinbelow with reference to the accompanying drawings, in which FIG. 1 shows a schematic view of the bottom surface of a semiconductor device package according to a preferred embodiment of the invention;

Figure 1:
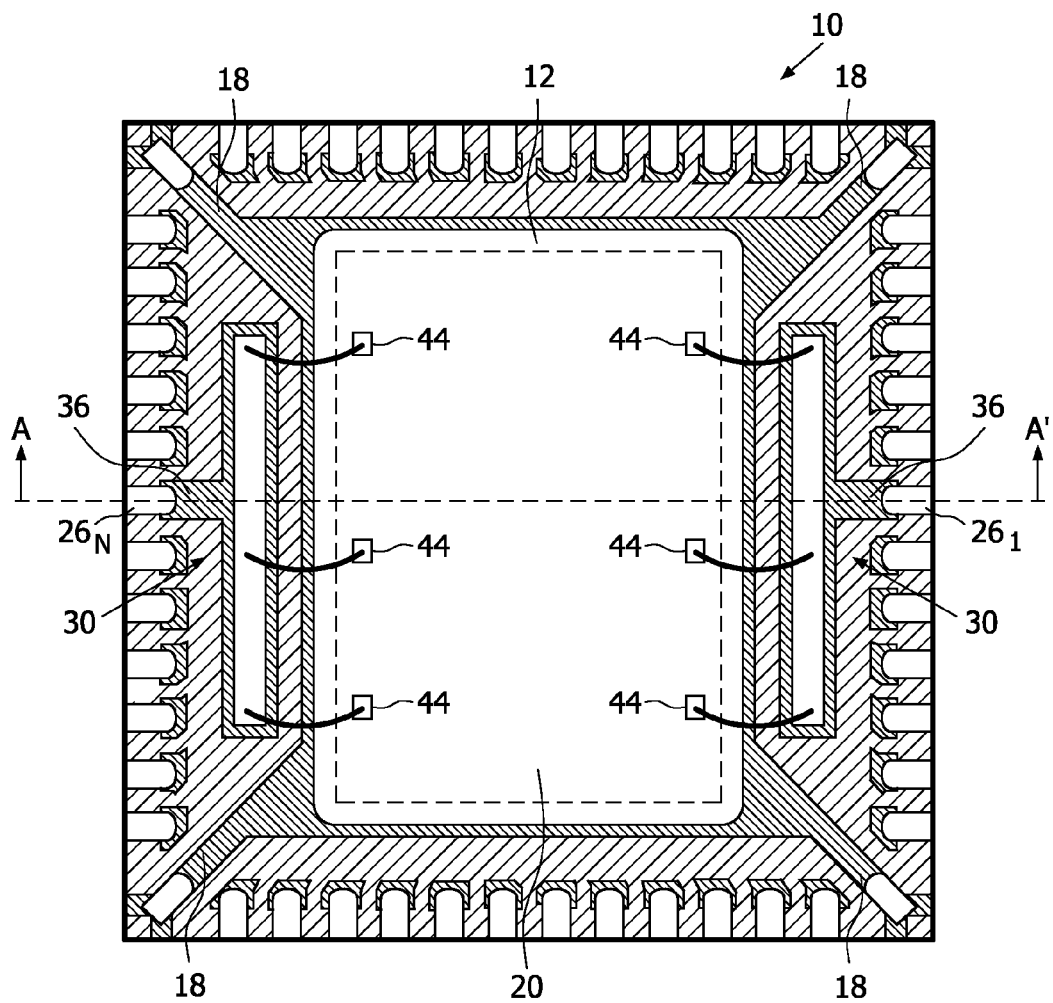

It should be noted first that FIG. 1 schematically shows the exposed bottom surfaces, represented by the non-hatched areas, parts filled with encapsulation material, represented by areas hatched from bottom left to top right, and the half-etched parts represented by the areas hatched from top left to bottom right, respectively. The latter parts one normally will not be able to see when looking at the bottom surface (one will see encapsulation material instead). With respect to FIG. 2, it should be noted that only the left half of the package is shown in cross-section, since the package is symmetrical with respect to line A-A'.

Figure 2:
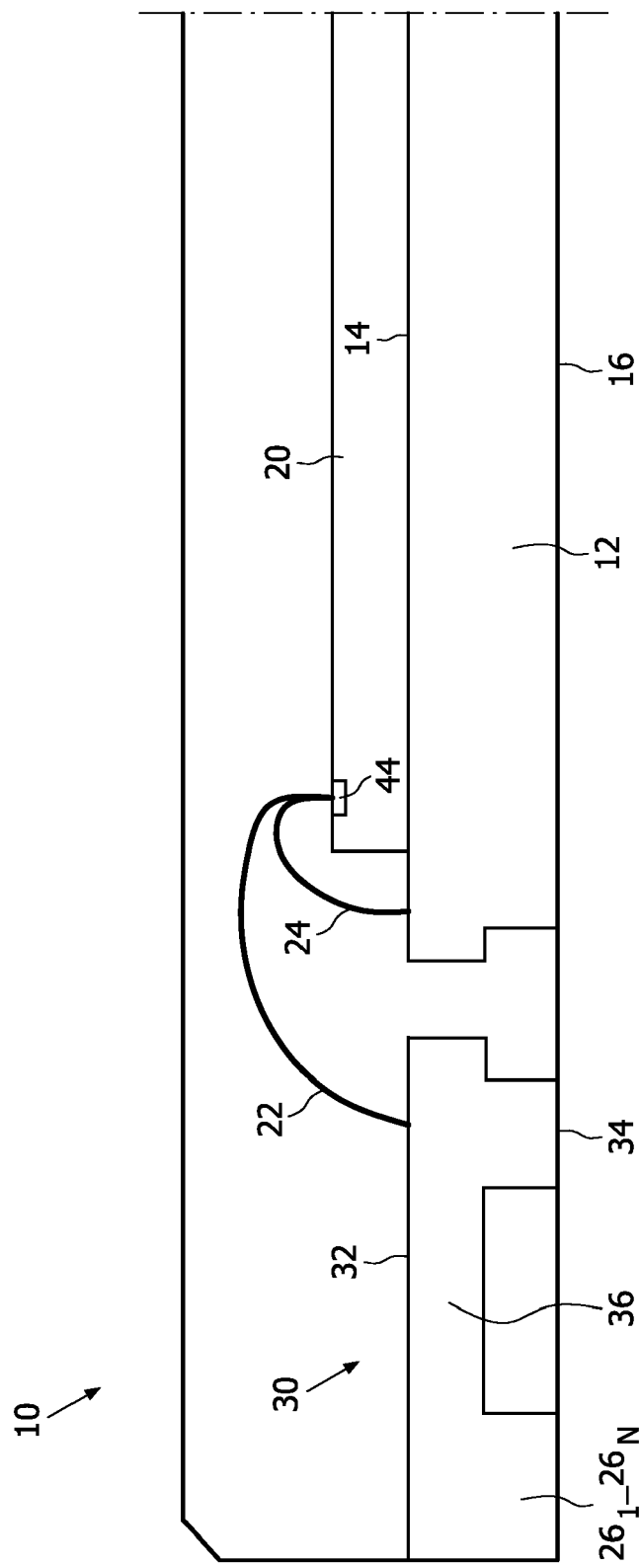
FIG. 2 shows a cross-sectional view along line A-A' in FIG. 1.

Referring now to FIGS. 1 and 2, a semiconductor device package 10 with a substantially rectangular shape is shown. The package comprises a die attach pad 12 having a top surface 14 and an exposed bottom surface 16, four tie bars 18 extending from the die attach pad 12 towards diagonally opposed corners of the package, and a plurality of contact pads $26_1$-$26_n$ disposed between the die attach pad and a row of contact pads, the strip having at least one lateral part that is connected to at least one of the contact pads in the row, said contact pads being provided in at least 4 rows that correspond to the rectangular shape of the package. Furthermore (see FIG. 2), the package 10 comprises a semiconductor die 20 mounted on the top surface 14 of the die attach pad and having bonding pads 44 formed thereon, a plurality of electrical connections 22,24 between selected ones of the bond pads 44 and corresponding ones of the contact pads $26_1$-$26_n$. An encapsulation 28 encapsulates the semiconductor die 20, the top surface 14 of the die attach-pad 12, the electrical connections 22,24, the top surface of the tie bars 18 and the top surfaces of the contact pads, and leaves the bottom surface 16 of the die attach pad 12 and the bottom surface of the contact pads exposed.

As can best be seen in FIG. 1, two strips 30 are disposed between the die attach pad and a corresponding row of contact pads. Each strip 30 comprises at least one lateral part 36 that is connected to at least one of the contact pads in the row (in FIG. 1 pads $26_n$ and $26_1$ respectively). The strip allows that bond pads 44 at various locations on the semiconductor die 20 (indicated in FIG. 1 by a square of dotted lines) adjacent to the strip can be connected therewith, e.g. by means of wires. Via lateral part 36, these connections are directly linked to a corresponding contact pad (in FIG. 1 contact pad $26_1$ and $26_n$ respectively). This means that bond pads 44 at various locations on the semiconductor die 20 are directly connected to one contact pad only, which bond pads otherwise would have to be connected to several contact pads in a corresponding row. Consequently, the strip allows reducing the number of contact pads, and thus reduces package size and cost.

The die attach pad 12, the tie bars 18, the strips 30 and the contact pads $26_1$-$26_n$ are all made from conductive material (see description of typical design flow for a lead frame below).

Before any electrical connections are made, the contact pads $26_1$-$26_n$ are electrically isolated from each other and from the die attach-pad 12. Also the strips 30 are at first electrically isolated from the die attach pad 12.

FIG. 1 shows that the two strips 30 are disposed adjacent to opposing sides of the die attach pad. However, according to the invention, it is also possible to dispose one strip only or to dispose three or four strips adjacent to arbitrary sides of the die attach pad.

In case two or more strips are disposed, it is conceivable to directly link two or more strips, creating an L- or U-shaped strip. It is also possible to interconnect two neighboring strips, e.g. by wire bonding.

FIG. 2 shows the electrical connections 22,24 in more detail. They comprise wire bonds that are formed between a bond pad 44 on the semiconductor die 20 and the die attach pad 12 or the strip 30 respectively. Although not shown in the FIGS. 1 and 2, logically there are also wire bonds between bond pads 44 and the regular contact pads $26_1$-$26_n$.

FIG. 2 shows the lateral part 36 in more detail. It can be seen that this part is half-etched and that there is a direct link to a corresponding contact pad. It is conceivable however to apply a wire bond between the strip and the corresponding contact pad, instead of a direct link. Furthermore, it is possible to make an indirect connection via the electronic carrier or printed circuit board.

FIG. 2 also shows the encapsulated top surface 32, and the exposed bottom surface 34 of the strip 30. An exposed bottom surface 34 is beneficial during wire bonding when the strip needs to be supported for example by a support tape (note that the encapsulation material is not yet present during wire bonding).

Although this is not shown in FIGS. 1 and 2, it is possible that the strip comprises ore or more lateral parts that are connected to two contact pads in a corresponding row. Preferably, these lateral parts and the corresponding contact pads are disposed nearby outer ends of the strip in order to improve the mechanical stability of the strip, which is especially important during manufacturing of the package (see description of typical design flow for a lead frame design below).

Figure 3:
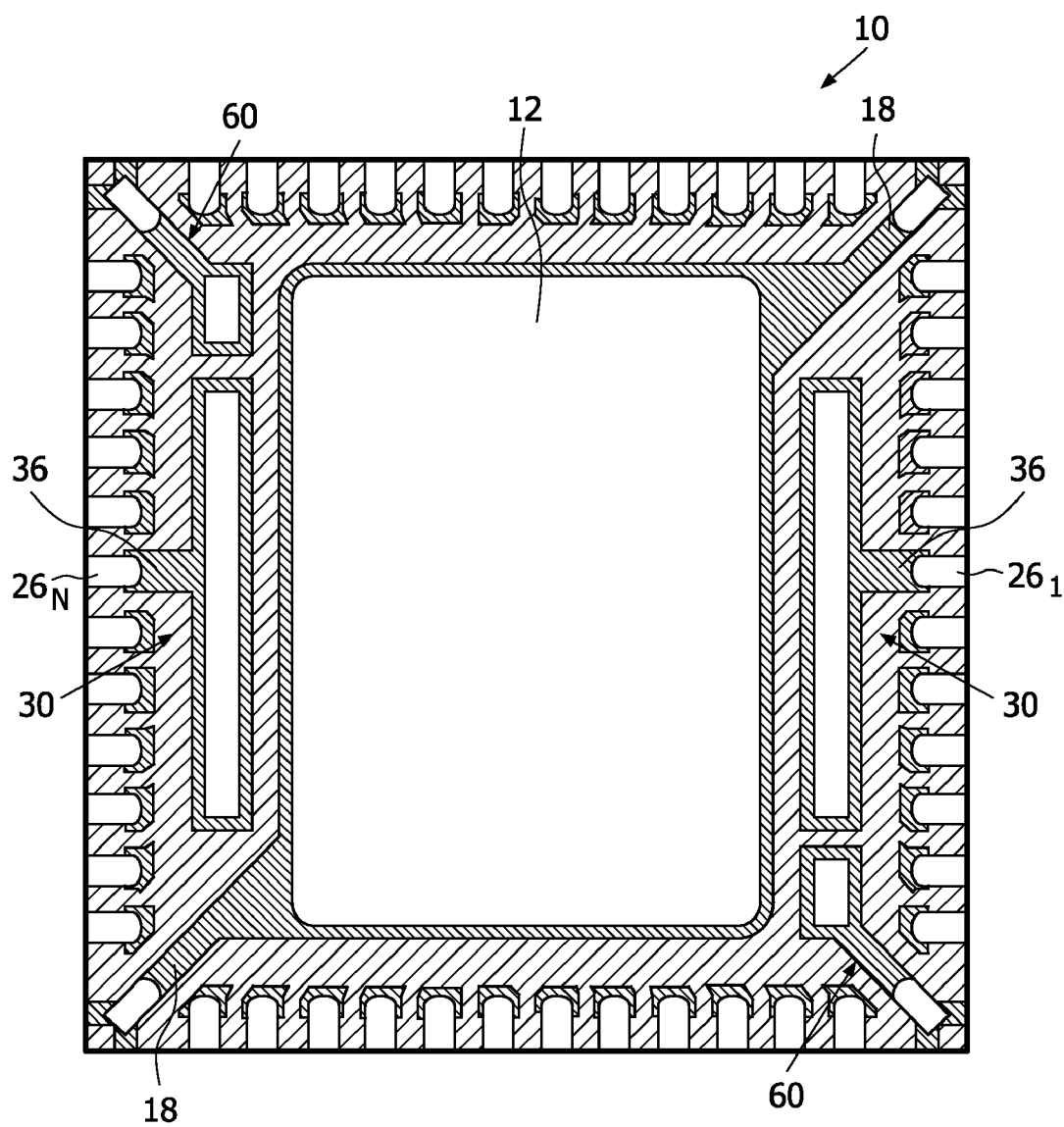
FIG. 3 shows a schematic view of the bottom surface of a semiconductor device package according to another preferred embodiment of the invention.

FIG. 3 shows a schematic view of the bottom surface of a semiconductor device package according to another preferred embodiment of the invention. Besides the two additional strips 30 and other components as shown in FIGS. 1 and 2, two additional contact pads 60 are shown, that are formed by replacing two tie bars by such additional contact pads (as compared to regular packages with four tie bars). In the preferred embodiment shown in FIG. 1, two tie bars 18 are present to provide the necessary support for the die attach pad during manufacturing of the package. According to the invention, it is also possible to have three additional contact pads, thus leaving one tie bar only. Alternatively, one can replace just one tie bar by an additional contact pad, thus leaving three tie bars at maximum.

The additional contact pads 60 allow reducing the number of contact pads in the respective rows. Since package size is mainly determined by the number of contact pads provided in the rows, the additional contact pads 60 allow a smaller package size and thus a cheaper package.

With the embodiment according to FIG. 3, it was found that a 6×6 mm package provided with 50 contact pads could be used, while normally a 7×7 mm package provided with 56 contact pads was needed for the same semiconductor die. The number of 50 contact pads could be obtained by applying two additional contact pads disposed in two corners of the package that normally contained 4×12=48 contact pads.

Typically, the total number of contact pads for a package according to the invention is between 10-100, more preferably between 30-70. Although it is described as comprising one semiconductor die only, the package according to the invention is very well suited to be applied for so-called chip on chip packages, as described in for example WO-A 2004/057668. In such a chip-on-chip package, the connection from the bonding pads of the die to the contact pads may, in one embodiment, be constituted by a first connection from bonding pad to the second chip, an interconnect on the second chip and a second connection from chips to contact pad. In this embodiment, this second chip has a larger surface area than the semiconductor die on the die pad. The second chip may be an integrated circuit, an image sensor, but also a passive chip, e.g. a network of passive components, or a peripheral chip comprising a plurality of independent circuit portions between selected ones of the bonding pads and corresponding ones of the contact pads, such as ESD protection. Also packages comprising more components than just one or a few semiconductor dies (system in package) will benefit from the present invention. These components may be present on the same die pad or on individual die pads. The strip allows the provision of power supply or a well-defined reference potential near to the specific components. This appears advantageous, as the specific components may have different requirements. Moreover, the strip may be used as a die pad for certain components, such as passive components or filters. Wire bonds may then be formed between the semiconductor die and the component. Additionally, the strip may be used for providing a potential or voltage supply to more than one component, or as a specific interconnect pad between two components.

Possible applications for packages according to the invention are as packages for power management semiconductors, or more generally speaking, semiconductors that produce relatively much heat.

Typically, the invention is suited to be applied with so-called QFN (quad flat no lead) packages. Sometimes these packages are referred to as HVQFN, MLF, LPCC, DQFN or MCP packages. However, it is conceivable to apply the invention for so-called QFP packages as well. In that case the additional contact pad will be an additional lead that extends from a corner of the package.

Although not illustrated, a typical design flow for a leadframe design according to an embodiment of the present invention is summarized as follows. Firstly, an appropriately dimensioned metallic, typically copper, band is provided. Then a first, appropriately patterned mask is used to etch both upper and lower surfaces of the band, thus providing the basic definition of the leadframe including the tie bars, die attach pad, and the strips according to the invention. A second appropriately patterned mask may then be used to half-etch the lower surfaces of the copper band. The appropriately patterned band may then be plated with, for example, a nickel-palladium NiPd protective layer. The patterned band, i.e. leadframe, is then attached to a support tape. Having defined and prepared the leadframe, a semiconductor device package can now be produced, wherein: a semiconductor die is attached to the die attach pad; the appropriate wire bonds are made; the encapsulation is appropriately molded around the leadframe and the semiconductor die; and finally the resultant plurality of packaged semiconductor devices are singulated from the strip by accurately sawing or punching through the leadframe.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The verb "to comprise" and its conjugations does not exclude the presence of elements or steps other than those listed in any claim or the specification as a whole. The singular reference of an element does not exclude the plural reference of such elements and vice-versa. The term 'half-etching' as used in the context of the application generally refers to an etching treatment in which between approximately 40 and 85% of the thickness is removed, and preferably between 45 and 55%.

The invention claimed is:

1. A semiconductor device package with a substantially rectangular shape comprising:
    a die attach pad having a top surface and a bottom surface;
    a plurality of contact pads provided in at least four rows that correspond to the rectangular shape of the package, each contact pad having a top surface and a bottom surface;
    at least two tie bars for supporting the die attach pad until the singulation of the package during manufacturing thereof, the tie bars having a top surface and a bottom surface and extending from the die attach pad towards a corner of the package;
    a semiconductor die mounted on the top surface of the die attach pad and having bonding pads formed thereon;
    a plurality of electrical connections between selected ones of the bond pads and corresponding ones of the contact pads;
    an encapsulation encapsulating the semiconductor die, the top surface of the die attach pad, the electrical connections, the top surface of the tie bars and the top surfaces of the contact pads, and leaving the bottom surface of the die attach pad and the bottom surface of the contact pads exposed;
    characterized in that, at least one strip having a top surface and a bottom surface is disposed between the die attach pad and a corresponding row of contact pads, the strip having at least one lateral part that is connected to a single contact pad of the contact pads in said row, electrical connections being provided between the strip and selected bond pads on the semiconductor die adjacent to the strip.

2. A semiconductor device package as claimed in claim 1, characterized in that two strips are disposed between the die attach pad and a corresponding row of contact pads.

3. A semiconductor device package as claimed in 2, characterized in that the strips are disposed adjacent to opposing sides of the die attach pad.

4. A semiconductor device package as claimed in claim 1, characterized in that the bond pads on the semiconductor die that are electrically connected to a strip are used for power supply signals and or signals requiring a low ohmic connection, such as reference voltage signals or ground signals.

5. A semiconductor device package as claimed in claim 1, characterized in that the strip comprises lateral parts that are connected to two contact pads in a corresponding row.

6. A semiconductor device package as claimed in claim 1, characterized in that the bottom surface of the strip is exposed.

7. A semiconductor device package as claimed in claim 1, characterized in that the electrical connections comprise wires that are bonded between the bond pads and the contact pads or the strips.

8. A leadframe that is used to manufacture a semiconductor device package as claimed in claim 1.

9. An electronic device comprising an electronic carrier, such as a printed circuit board, on which a semiconductor device package as claimed in claim 1 is connected.

10. A semiconductor device package as claimed in claim 1, characterized in that the at least two tie bars includes exactly two tie bars.

11. A semiconductor device package as claimed in claim 1, characterized in that the plurality of contact pads includes exactly fifty contact pads.

* * * * *